(12) United States Patent
Katoda

(10) Patent No.: US 7,759,693 B2
(45) Date of Patent: *Jul. 20, 2010

(54) PHOTONIC DEVICES FORMED OF HIGH-PURITY MOLYBDENUM OXIDE

(76) Inventor: Takashi Katoda, 4804-83, Ikku, Kochi-shi, Kochi (JP) 780-8130

( * ) Notice: Subject to any disclaimer, the term of this patent is extended or adjusted under 35 U.S.C. 154(b) by 31 days.

This patent is subject to a terminal disclaimer.

(21) Appl. No.: 10/848,145

(22) Filed: May 19, 2004

(65) Prior Publication Data

US 2004/0240501 A1 Dec. 2, 2004

(30) Foreign Application Priority Data

May 30, 2003 (JP) .............................. 2003-154107

(51) Int. Cl.
*H01L 29/24* (2006.01)
*H01L 29/22* (2006.01)

(52) U.S. Cl. ........................................ 257/103; 257/94

(58) Field of Classification Search ................. 257/103, 257/94

See application file for complete search history.

(56) References Cited

U.S. PATENT DOCUMENTS

| | | | | |
|---|---|---|---|---|
| 3,503,798 A | * | 3/1970 | Takayanagi et al. | 427/255.18 |
| 3,728,594 A | * | 4/1973 | Yim et al. | 257/43 |
| 4,373,145 A | * | 2/1983 | McCarthy et al. | 313/503 |
| 4,965,594 A | * | 10/1990 | Komuro | 347/62 |
| 5,038,609 A | * | 8/1991 | Kumada | 73/204.24 |
| 5,293,510 A | | 3/1994 | Takenaka | |
| 5,571,612 A | | 11/1996 | Motohiro et al. | |
| 5,838,029 A | * | 11/1998 | Shakuda | 257/190 |
| 5,990,500 A | * | 11/1999 | Okazaki | 257/99 |
| 6,252,158 B1 | | 6/2001 | Higashikawa | |
| 6,498,358 B1 | | 12/2002 | Lach et al. | |
| 6,513,362 B1 | | 2/2003 | Yadav et al. | |
| 6,627,959 B1 | | 9/2003 | Tuller et al. | |
| 7,250,630 B2 | | 7/2007 | Katoda | |
| 2004/0240501 A1 | | 12/2004 | Katoda | |

(Continued)

FOREIGN PATENT DOCUMENTS

EP 1 482 564 12/2004

(Continued)

OTHER PUBLICATIONS

Osterwald et al. Molybdenum trioxide/silicon photodiodes, Appl. Phys. Lett. 35(10), Nov. 15, 1979.*

(Continued)

*Primary Examiner*—Minsun Harvey
*Assistant Examiner*—Marcia A. Golub
(74) *Attorney, Agent, or Firm*—Eric J. Robinson; Robinson Intellectual Property Law Office, P.C.

(57) ABSTRACT

The present invention is directed to photonic devices which emit or absorb light with a wavelength shorter than that GaN photonic devices can emit or absorb.

The devices according to the present invention are formed using molybdenum oxide of a high purity as a light emitting region or a light absorbing region. New inexpensive photonic devices which emit light with a wavelength from blue to deep ultraviolet rays are realized.

The devices according to the present invention can be formed at a temperature relating low such as 700° C.

2 Claims, 3 Drawing Sheets

U.S. PATENT DOCUMENTS

| | | |
|---|---|---|
| 2004/0251457 A1 | 12/2004 | Katoda |
| 2005/0062409 A1 | 3/2005 | Yamazaki et al. |
| 2005/0156197 A1 | 7/2005 | Tsutsui et al. |
| 2005/0263756 A1 | 12/2005 | Yatsunami et al. |
| 2006/0038242 A1 | 2/2006 | Hsu et al. |
| 2006/0091797 A1 | 5/2006 | Tsutsui et al. |

FOREIGN PATENT DOCUMENTS

| | | |
|---|---|---|
| JP | 52-046098 | 11/1977 |
| JP | 2004-356481 | 12/2004 |
| JP | 2002-217425 | 8/2006 |

OTHER PUBLICATIONS

European Search Report, EP 04 01 1665, dated Jul. 8, 2004.
Specification, Drawings, Claims and Abstract filed Jan. 12, 2006 for U.S. Appl. No. 11/330,153.
Transmittal of Priority Document filed Jan. 26, 2006 for U.S. Appl. No. 11/330,153.
Non-Final Office Action mailed Oct. 2, 2007 for U.S. Appl. No. 11/330,153.
Amendment filed Jan. 2, 2008 for U.S. Appl. No. 11/330,153.
Information Disclosure Statement filed Jan. 2, 2008 for U.S. Appl. No. 11/330,153.
Final Office Action mailed Mar. 20, 2008 for U.S. Appl. No. 11/330,153.
Response filed Jun. 20, 2008 for U.S. Appl. No. 11/330,153.
Advisory Action mailed Jul. 31, 2008 for U.S. Appl. No. 11/330,153.
Response filed Aug. 20, 2008 for U.S. Appl. No. 11/330,153.
Supplemental Response filed Aug. 21, 2008 for U.S. Appl. No. 11/330,153.
Non-Final Office Action mailed Sep. 12, 2008 for U.S. Appl. No. 11/330,153.
Amendment filed Dec. 12, 2008 for U.S. Appl. No. 11/330,153.
Information Disclosure Statement filed Jan. 27, 2009 for U.S. Appl. No. 11/330,153.
Specification, Drawings, Claims and Abstract filed Jan. 12, 2006 for U.S. Appl. No. 11/330,154.
Preliminary Amendment Document filed Jan. 12, 2006 for U.S. Appl. No. 11/330,154.
Transmittal of Priority Document filed Jan. 26, 2006 for U.S. Appl. No. 11/330,154.
Non-Final Office Action mailed Oct. 2, 2007 for U.S. Appl. No. 11/330,154.
Amendment filed Jan. 2, 2008 for U.S. Appl. No. 11/330,154.
Information Disclosure Statement filed Jan. 2, 2008 for U.S. Appl. No. 11/330,154.
Amendment filed Jan. 9, 2008 for U.S. Appl. No. 11/330,154.
Final Office Action mailed Mar. 21, 2008 for U.S. Appl. No. 11/330,154.
Response filed Jun. 23, 2008 for U.S. Appl. No. 11/330,154.
Advisory Action mailed Jul. 29, 2008 for U.S. Appl. No. 11/330,154.
Amendment filed Aug. 21, 2008 for U.S. Appl. No. 11/330,154.
Supplemental Amendment filed Sep. 11, 2008 for U.S. Appl. No. 11/330,154.
Information Disclosure Statement filed Sep. 16, 2008 for U.S. Appl. No. 11/330,154.
Non-Final Office Action mailed Sep. 17, 2008 for U.S. Appl. No. 11/330,154.
Amendment filed Dec. 17, 2008 for U.S. Appl. No. 11/330,154.
Information Disclosure Statement filed Dec. 17, 2008 for U.S. Appl. No. 11/330,154.
Specification, Drawings, Claims and Abstract filed Jun. 9, 2004 for U.S. Appl. No. 10/863,288.
Non-Final Official Action mailed May 2, 2006 for U.S. Appl. No. 10/863,288.
Amendment filed Aug. 2, 2006 for U.S. Appl. No. 10/863,288.
Final Official Action mailed Oct. 16, 2006 for U.S. Appl. No. 10/863,288.
Amendment filed Feb. 16, 2007 for U.S. Appl. No. 10/863,288.
Notice of Allowability mailed Mar. 20, 2007 for U.S. Appl. No. 10/863,288.
Issue Notification mailed Mar. 20, 2007 for U.S. Appl. No. 10/863,288.
European Search Report (Application No. 06000615.2) dated Aug. 18, 2008.
Chen et al., "Structural, Electrical, and Optical Properties of Transparent Conductive Oxide ZnO:Al Films Prepared by DC Magnetron Reactive Sputtering," Journal of Vacuum Science and Technology, Part A, vol. 19, No. 3, May 2001, pp. 963-970.
Ferreira et al., "Lithium Insertion and Electrochromism in Polycrystalline Molybdenum Oxide Films," Solid State Ionics, vol. 136-137, Nov. 2, 2000, pp. 357-363.
Guha et al., "Ultraviolet and Violet GaN Light Emitting Diodes on Silicon," Applied Physics Letters, vol. 72, No. 4, Jan. 26, 1998, pp. 415-417.
Dalmasso et al., "Green Electroluminescent (Ga, In, Al)N LEDs Grown on Si(111)," Electronic Letters, vol. 36, No. 20, Sep. 28, 2000, pp. 1728-1730.
Pettus C., "A Molybdenum-Oxide Negative-Resistance Device", Jan. 1965, Proc. IEEE, vol. 53, No. 1, p. 98.
Office Action (Application No. 2003-154107) Dated Oct. 27, 2008.
Ivanova, T., et al., "Investigation of CVD Molybdenum Oxide Films," Materials Letters, vol. 53, Apr. 2002, pp. 250-257.
Office Action (Application No. 2005-010248) Dated Oct. 14, 2008.

\* cited by examiner

PHOTONIC DEVICES FORMED OF HIGH-PURITY MOLYBDENUM OXIDE

BACKGROUND OF THE INVENTION

1. Field of the Invention

The present invention relates to a semiconductor photonic devices formed of high-purity molybdenum oxide which emit or absorb light with a short wavelength.

More particularly, the present invention relates to new light emitting diodes which emit blue light and have possibility to overcome problems accompanying to devices made up of known semiconductors such as gallium nitride (GaN) or silicon carbide (SiC). Moreover, the invention relates to photonic devices which emit light with a wavelength shorter than 361 nm in which GaN light-emitting diodes can emit or selectively absorb light having a wavelength shorter than 361 nm.

2. Related Background Art

Light emitting diodes which emit blue light have developed recently in order to realize three primary colors of light and to obtain light with a shorter wavelength for digital video disc (DVD). Developed blue-light emitting devices use gallium nitride (GaN) as an active region which is very important to emit light. The bandgap of GaN is about 3.43 eV which corresponds to a wavelength of 361 nm. Although blue light can be obtained from GaN devices, there are some difficult problems. At first, bulk crystal of GaN has not been obtained because an equilibrium vapor pressure of nitrogen is very high relative to that of gallium. Therefore, substrates made up of sapphire or silicon carbide (SiC) are used. GaN cannot be formed directly on a sapphire substrate because there is lattice mismatch of 16% between sapphire and GaN. Therefore a buffer layer of aluminum nitride (AlN) is formed on a sapphire substrate before growth of GaN. AlN is resistive because it is difficult to dope impurities into AlN. A structure and its fabrication process, therefore, are severely restricted. On the other hand, SiC substrates are very expensive because bulk crystal of SiC can be grown at a very high temperature of 2200-2400° C.

Zinc oxide (ZnO) has possibility to be used to form a blue-light emitting device. However, its bandgap is 3.2 eV which corresponds to a light wavelength of 387 nm which is larger than that GaN devices emit. Moreover, ZnO has many problems to be solved to realize practical devices.

The shortest wavelength of light which semiconductor photonic devices can emit at present is that GaN devices can emit. The maximum density of DVD memory is decided by the wavelength. Therefore, a new photonic device which can emit light with a shorter wavelength is expected in order to increase the maximum density of DVD memory or to replace gas lasers such as He—Cd laser. In addition, a new blue-light emitting device made up of new material is expected because present blue-light emitting devices have many problems as described above. Moreover, a new device which can emit light with a wavelength shorter than 361 nm which GaN devices can emit or a shorter wavelength of deep ultraviolet rays such as 250-350 nm is expected.

The problem to be solved to realize a new device is to obtain a new substrate which replaces expensive substrate such as sapphire or SiC.

The second problem is to realize new semiconductor which can be grown at a lower temperature at which GaN or SiC layers are formed. Large energy is necessary to form semiconductor layers at a high temperature. In addition, there are possibilities that atoms move between layers and a composition is disturbed or dopants move near the interface between layers. It is necessary to form layers of GaN or SiC at a temperature higher than 1000° C.

SUMMARY OF THE INVENTION

The present invention is directed to photonic devices which emit or absorb light with a wavelength shorter than that GaN photonice devices can emit or absorb.

The devices according to the present invention are formed using molybdenum oxide of a high purity as a light emitting region or a light absorbing region. New inexpensive photonic devices which emit light with a wavelength from blue to deep ultraviolet rays are realized.

The devices according to the present invention can be formed at a temperature relatively low such as 700° C.

DETAILED DESCRIPTION OF THE PREFERRED EMBODIMENTS

Reference will now be made in greater detail to preferred embodiments of the invention.

The problems described above were resolved by using high-purity molybdenum oxide as a light emitting region of photonic devices.

Molybdenum oxide has been studied for catalyst and its properties are shown for example in the following paper. Martin Lerch, Reinhard Schmäcker, Robert Schlögl, "In situ Resonance Raman Studies of Molybdenum Oxide Based Selective Oxidation Catalysts" Fachbereich Chemie der Technischen Universität Berlin zur Erlongung des akademischen Grades, März 2001, Berlin.

The paper is included as a reference literature of this specification. However, application of molybdenum oxide to photonic devices, such as a light emitting diode or a laser diode is not proposed in the paper. Although the bandgap of molybdenum oxide is reported as 2.9-3.15 eV in page 8 of the paper, any effects obtained by using molybdenum oxide in photonic devices are not described. The values of the bandgap, 2.9-3.15 eV, are the results for molybdenum oxide formed by physical method such as sputtering or deposition in vacuum. In addition, a purity of the sample, that is molybdenum oxide, is not shown in the paper. In general, semiconductor material used in photonic devices is high-purity crystal and its bandgap is measured for such crystal. However the bandgap shown in the above paper is that of molybdenum oxide formed by deposition in vacuum because molybdenum oxide is considered as catalyst in the paper. Material formed by deposition is usually amorphous and it is well know to the peoples in the art that the material has disordered structure. In addition, a thickness of a film formed by deposition in vacuum is generally small such as 100 nm and a thickness of 1 μm is too large to be formed by deposition in vacuum. When a thickness is small size such as 100 nm, properties such as a bandgap of a film are affected by a substrate and change with a thickness of a film or material of a substrate. The bandgap shown above was obtained for such films with small thicknesses and was not necessarily identical to that inherent to crystalline molybdenum oxide with a larger thickness such as 1 μm. The reason why a bandgap was not measured for crystalline molybdenum oxide with a thickness larger than 100 nm in the paper described above is considered that application of molybdenum oxide to photonic devices such as a light emitting or laser diodes was not intended in the paper.

Figure 1:
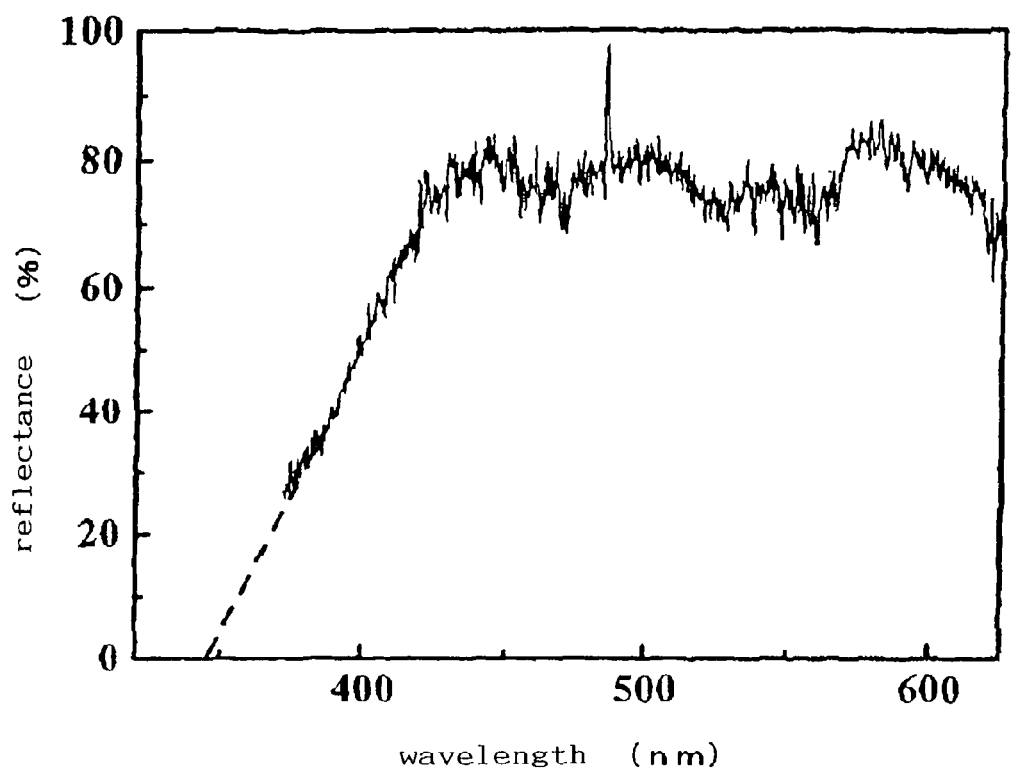
FIG. 1 shows the optical reflection characteristics of the molybdenum oxide formed by oxidation of high-purity molybdenum at 550° C.

The inventor of this invention measured properties of the molybdenum oxide formed by oxidation of a molybdenum plate with a purity of 99.99% in oxygen atmosphere with a purity of 99.9995%. FIG. 1 shows the optical reflection characteristics of the molybdenum oxide formed by oxidation of the molybdenum plate at 550° C. for 120 minutes. A thickness of the molybdenum oxide was 10.2 μm. The longest wavelength at which absorption begins, that is at which reflection is zero which is obtained by extrapolating the spectra shown in FIG. 1 gives the bandgap of the molybdenum oxide. Light with a wavelength shorter than 388 nm was aborbed for this sample. It means that the bandgap of the sample was 3.66 eV. Because a thickness of the sample was 10.2 μm, there is no effect of the substrate and the value of the bandgap must be one inherent to molybdenum oxide. The reason why the value of the bandgap 3.66 eV is larger than that 2.9-3.15 eV reported by Martin Lerch et al as shown in the above paper is considered as follows. It is well known in the art that material with disordered structure such as a film formed by deposition in vacuum forms so-called band tail in the forbidden region of the energy band structure and its effective bandgap is decreased. The value reported by Martin Lerch et al was obtained for samples with disordered structure. On the other hand, the value obtained by the inventor is that for the high-purity crystalline molybdenum oxide. Therefore the value of the bandgap measured by this inventor was larger than those reported by Martin Lerch et al. Following data show in detail the results for high-purity crystalline molybdenum oxide obtained by this inventor.

Figure 2:
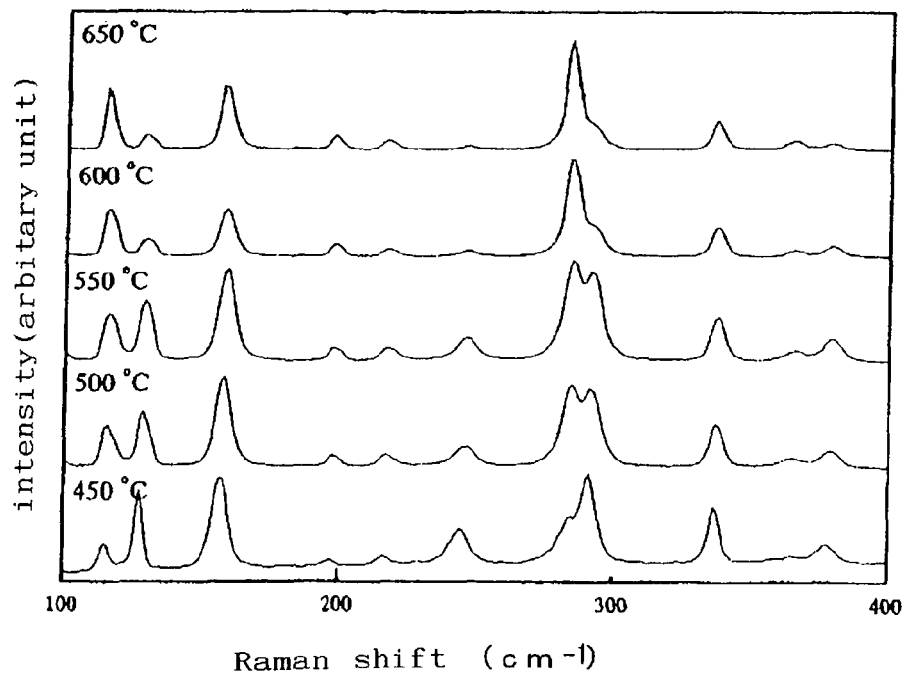
FIG. 2 shows the Raman scattering spectra from molybdenum oxides formed by oxidation of high-purity molybdenum at various temperatures from 450 to 650° C.
Figure 3:
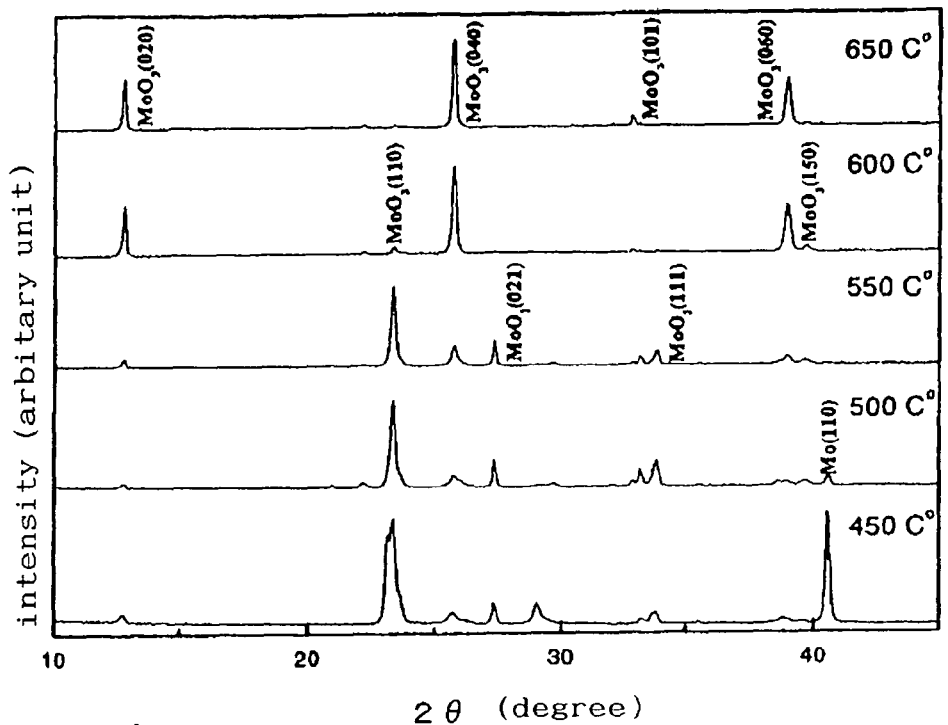
FIG. 3 shows the X-ray diffraction spectra from molybdenum oxides formed by oxidation of high-purity molybdenum at various temperatures from 450 to 650° C.

FIG. 2 shows the Raman scattering spectra and FIG. 3 shows the X-ray diffraction spectra from the molybdenum oxide formed similarly to that shown in FIG. 1 except that the molybdenum oxide was obtained by oxidation at a temperature from 450 to 650° C. The spectra shown in FIGS. 2 and 3 mean that the main composition of the molybdenum oxide was $MoO_3$. However it is possible that other compositions were included under the detection limit. The bandgap obtained from the optical reflection spectra as described for FIG. 1 was 3.45-3.85 eV for the molybdenum oxide formed at 450-650° C. A bandgap is affected by structure, that is crystal or amorphous, disorder of crystal, a size of crystalline particle if the material is poly-crystalline, or strain even the material has the same composition. Therefore it should be notified that molybdenum oxide with a composition of $MoO_3$ does not have always the bandgap of 3.45-3.85 eV. In other words, the bandgap of 3.45-3.85 eV depends on structure and strain as well as composition. The spectra shown in FIG. 3 consist of sharp peaks and it means that the sample is pure crystal. Moreover, there is possibility that a larger bandgap will be obtained by making quality of the crystal better.

Figure 4:
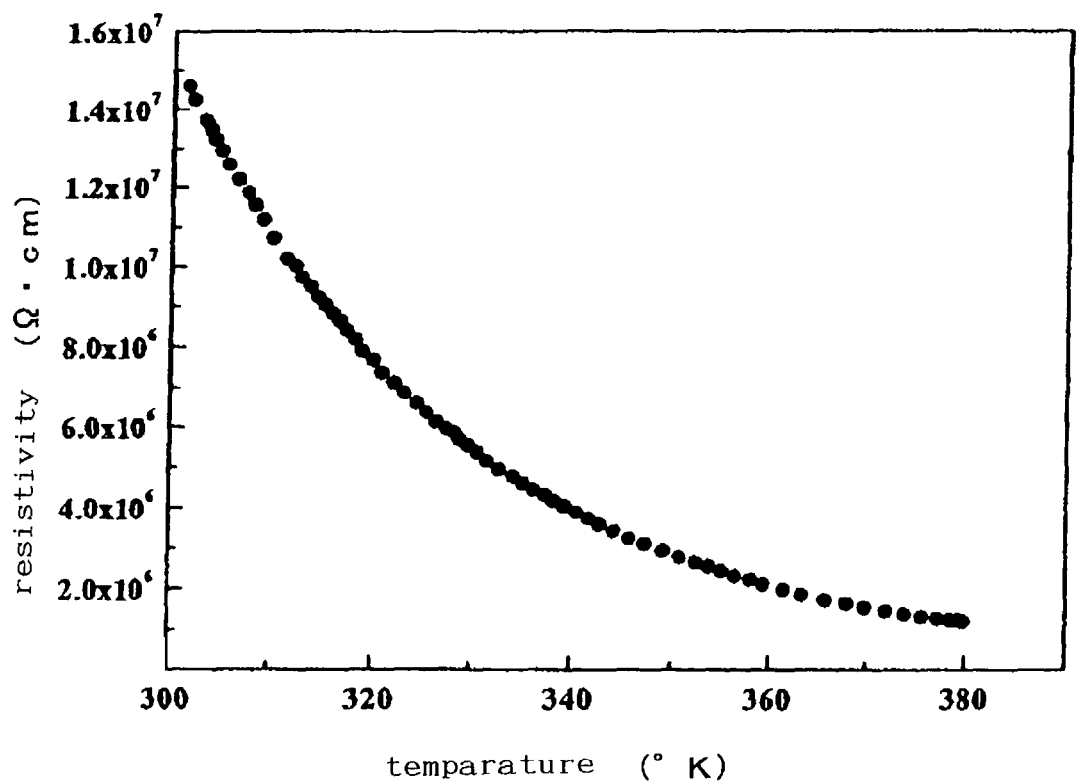
FIG. 4 shows temperature dependence of the electrical resistance of molybdenum oxide formed by oxidation of high-purity molybdenum at 550° C.

FIG. 4 shows temperature dependence of electrical resistance of the molybdenum oxide whose optical reflectance property is shown in FIG. 1. As shown in the figure, resistance decreases with increase of temperature. It means that a carrier density increases with increase of temperature and it is phenomenon only semiconductor shows. That is, electrical conductivity which is reciprocal to resistance is determined by a carrier density and carrier mobility. Carrier mobility decreases with increase of temperature because effects of lattice vibration increase with temperature. Therefore if a carrier density does not increases with temperature such as metal or insulating material, conductivity decreases with increase of temperature and resistance will increase. FIG. 4 shows as well as FIG. 1 that the molybdenm oxide is semi-conductor.

As shown above, crystalline molybdenum oxide can be obtained by oxidizing a molybdenum plate at a temperature lower than 650° C. A high-quality molybdenum oxide layer can be grown, for example, by vapor phase growth on a buffer layer of molybdenum oxide which has been grown previously on molybdenum oxide, for example, by vapor phase deposition on molybdenum oxide formed by oxidation of a molybdenum plate. Vapor phase growth of molybdenum oxide can be done at a temperature lower than 650° C. by a method which will be described in the other patent application. Therefore light emitting devices using molybdenum oxide can be fabricated fundamentally at a temperature lower than 650° C. using a molybdenum plate. Other materials such as aluminum (Al) crystal or Zinc sulfide (ZnS) can be used as a substrate. Lattice mismatches between molybdenum oxide and aluminum and between molybdenum oxide and zinc sulfide are 2.0% and 3.1%. They are much smaller than lattice mismatch between sapphire and gallium nitride, which is 16%. The problems accompanying to the present blue-light emitting devices, which are use of expensive substrates, growth at a very high temperature and complicated structures and fabrication process, are resolved by forming light emitting devices using fundamentally molybdenum oxide, and light with a wavelength shorter than 361 nm can be obtained. In addition, molybdenum oxide is used to form devices for which a smaller bandgap is preferable, the bandgap of the devices being controlled, for example, by doping of impurity.

Figure 5:
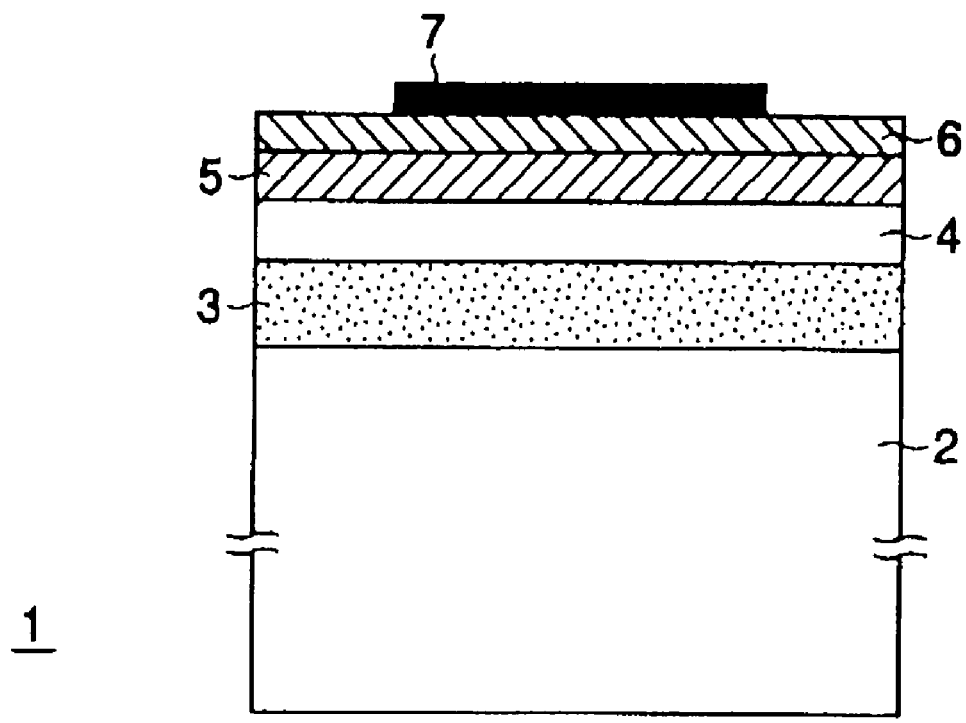
FIG. 5 is a schematic view of a structure of the light-emitting diode according to an embodiment of the present invention.

FIG. 5 shows schematically a structure of a light emitting diode (1) according to the first embodiment of the present invention. In this embodiment, a substrate (2) is a plate of molybdenum. However other material can be used as a substrate as far as it is electrically conductive. A layer (3) consists of molybdenum oxide formed by oxidizing a surface region of the molybdenum substrate (2). The layer (3) was formed by oxidizing a molybdenum plate with a purity of 99.99% at 550° C. in an atmosphere of oxygen with a purity of 99.9995% and its thickness is 6.0 μm. Although the layer (3) is not intentionally doped, it is n type. It is considered that oxygen vacancies act as donors. A buffer layer (4) is formed on the layer (3) in order to confine disorder in the layer (3) which originates because the layer (3) has a different composition from the substrate (2). For example, the layer (4) consists of molybdenum oxide formed, for example, by vapor phase deposition at 630° C. and is n type with a carrier density of $3 \times 10^{17}$ $cm^{-3}$. Its thickness is 4.0 μm. A layer (5) of molybdenum oxide is formed on the layer (4). The layer (5) is formed, for example, by vapor phase deposition at 600° C. and consists of crystal whose quality is better than that of the layer (4). The layer (5) is n type with a carrier density of $6 \times 10^{16}$ $cm^{-3}$. A thickness of the layer (5) is 3.0 μm. It is not necessary to form the layer (5) when it is not necessary to make efficiency of the light emitting diode (1) as high as possible. A layer (6) of p-type molybdenum oxide is formed on the layer (5). The layer (6) is doped, for example, with magnesium to a hole density of $1.0 \times 10^{17}$ cm$^{-3}$. A thickness of the layer (6) is 2.0 μm and formed for example, by vapor phase deposition. An electrode (7) is formed on the layer (6). The electrode (7) has a shape of doughnut (ring-shape) in order not to obstruct emission of light. Although the electrode is made up of gold in this embodiment, other metals can be used for the electrode. The electrode (7) is the upper electrode of the light emitting diode and the conductive molybdenum substrate acts as the bottom electrode. Characteristics of the light emitting diode (1) obtained by simulation are as follows. A voltage at the forward bias was 10V when current was 20 mA, a light power was 60 μw when current was 20 mA, and a peak wavelength was 330 nm.

Figure 6:
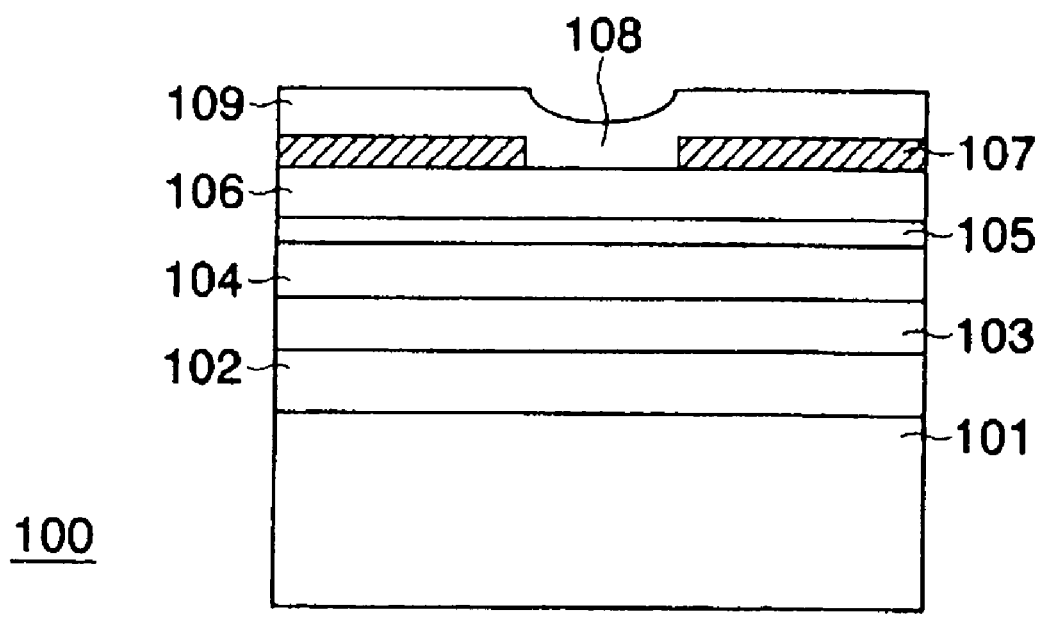
FIG. 6 is a schematic view of a structure of the laser diode according to the second embodiment of the present invention.

FIG. 6 shows a laser diode (100) according to the second embodiment of the present invention. Although a substrate (101) is a molybdenum plate, other materials can be used as substrates as far as they are conductive. The substrate (101) is desirable to be conductive. A layer (102) is formed by oxidizing a surface region of the substrate and consists of molybdenum oxide. The layer (102) was formed by oxidizing the molybdenum substrate with a purity of 99.99% in an atmosphere of oxygen with a purity of 99.995% at 550° C. for 40 minutes. The layer (102) shows n type although it is not intentionally doped. As described for the first embodiment, it is considered that oxygen vacancies act as donors. A buffer layer (103) is formed on the layer (102) in order to confine disorder in the layer (102). The disorder is introduced because the layer (102) has a different composition to the substrate (101). The layer (103) consists of molybdenum oxide formed by, for example, vapor phase deposition at 630° C. and is n type with a carrier density of $3 \times 10^{17}$ cm$^{-3}$. A thickness of the layer (103) is 3.0 μm. A layer (104) of chromium molybdenum oxide ($Cr_{0.1}Mo_{0.9}O_3$) is formed on the layer (103). The layer (104) of chromium molybdenum oxide has a larger bandgap than molybdenum oxide and acts as a cladding layer which confines carrier and light in an active layer of the laser diode. Although the layer (104) is not intentionally doped, it is n type with a carrier density of $6 \times 10^{16}$ cm$^{-3}$. It is formed, for example, by vapor phase deposition at 600° C. and its thickness is 3.0 μm. A layer (105) of a p type molybdenum oxide is formed on the layer (104) as an active layer of the laser diode (100). The layer (105) is formed, for example, by vapor phase deposition with doping to a hole density of $1 \times 10^{17}$ cm$^{-3}$. A thickness of the layer (105) is 0.5 μm. A layer (106) of chromium molybdenum oxide ($Cr_{0.1}Mo_{0.9}O_3$) is formed on the layer (105). A layer (106) has a larger bandgap than the active layer (105) of molybdenum oxide and acts as a cladding layer of the laser diode (100). The layer (106) is formed, for example, by vapor phase deposition and has a thickness of 3.0 μm. The layer (106) is doped, for example, with magnesium to p type with a hole density of $4.0 \times 10^{17}$ cm$^{-3}$. A layer (107) of silicon dioxide is formed on the layer (106) except a central stripe region (108). Because silicon dioxide is resistive, current is limited in the stripe region (108). The silicon dioxide layer (107) is formed, for example, by sputtering and has a thickness of 100 nm. An electrode layer (109) is formed on the layer (107) and in the stripe region (108). Although the electrode layer (109) is formed by vacuum deposition in an embodiment, other materials and other deposition methods can be used. The layer (109) is the upper electrode of the laser diode (100) while the substrate (101) acts as the bottom electrode because the substrate (101) is conductive. A width of the stripe region (108) is 20 μm in this embodiment. A length of the stripe region is 500 μm in this embodiment.

FIG. 6 shows one edge surface of the laser diode (100) and another edge surface is parallel to the edge surface apart from it by a length of the stripe (108). A pair of the parallel surfaces form a Fabry-Perot resonator of the laser diode (100). Function of a Fabry-Perot resonator in a laser diode is well known in the art. The two edge surfaces are half mirror in order to form a Fabry-Perot resonator. In this embodiment, the edge surfaces were formed by reactive ion etching using $CF_4$ and $H_2$ gases because cleavage cannot be used since the substrate (101) is molybdenum which is not crystal and hard. However other methods can be used to form the edge surfaces.

Characteristics of the laser diode (100) were shown by simulation as follows. A threshold current density and a threshold voltage were 5.05 kA/cm$^2$ and 16.2V, respectively at pulse oscillation of 5 μs/1 kHz. A peak wavelength was 330 nm.

FIG. 6 shows only essential elements of a laser diode and other elements can be added to improve characteristics of the laser diode. For example, a low resistive p type layer is formed on one cladding layer (106) in order to improve characteristics of an electrode.

Although in the embodiment shown in FIG. 6 the cladding layers (104) and (106) consist of chromium molybdenum oxide ($Cr_{0.1}Mo_{0.9}O_3$), chromium molybdenum oxide with other compositions ($Cr_xMo_{1-x}O_3$, X>0.1) or other materials can be used as far as they have larger bandgaps than that of molybdenum oxide.

Details of the present invention have been described with reference to the embodiments of a light emitting diode and a laser diode. Merits obtained from the fact that high-purity molybdenum oxide has a large bandgap are useful in other photonic devices based on the principle of the present invention. Such applications of the present invention are easily derived in the art and they are included in the scope of the present invention.

For example, molybdenum oxide is used in devices such as photo-conductive devices, photo-diodes, photo-transistors, CCD and solar cells. Molybdenum oxide is used in photo-absorption regions of such devices.

What is claimed is:

1. A light emitting diode comprising:
   a substrate made of molybdenum; and
   a layer of molybdenum oxide formed by oxidizing the main surface region of said substrate, a layer of crystalline n-type molybdenum trioxide formed by vapor phase growth and a layer of crystalline p-type molybdenum trioxide formed by vapor phase growth so that said layer of crystalline n-type molybdenum trioxide and said layer of crystalline p-type molybdenum trioxide form a pn junction from which light is emitted.

2. A light emitting diode comprising:
   a substrate made of molybdenum;
   a layer of molybdenum oxide formed by oxidizing the main surface region of said substrate, a buffer layer of molybdenum oxide formed by vapor phase growth which confines disorder in said molybdenum oxide layer;
   a layer of crystalline n-type molybdenum trioxide formed by vapor phase growth on said buffer layer; and
   a layer of crystalline p-type molybdenum trioxide formed by vapor phase growth on said crystalline n-type molybdenum trioxide layer so that said layer of crystalline n-type molybdenum trioxide and said layer of crystalline p-type molybdenum trioxide form a pn junction from which light is emitted.

* * * * *